(12) United States Patent
Vergis et al.

(10) Patent No.: US 10,310,547 B2
(45) Date of Patent: Jun. 4, 2019

(54) TECHNIQUES TO MIRROR A COMMAND/ADDRESS OR INTERPRET COMMAND/ADDRESS LOGIC AT A MEMORY DEVICE

(71) Applicant: Intel Corporation, Santa Clara, CA (US)

(72) Inventors: George Vergis, Portland, OR (US); Kuljit S. Bains, Olympia, WA (US); Bill Nale, Livermore, CA (US)

(73) Assignee: Intel Corporation, Santa Clara, CA (US)

( * ) Notice: Subject to any disclaimer, the term of this patent is extended or adjusted under 35 U.S.C. 154(b) by 119 days.

(21) Appl. No.: 15/266,991

(22) Filed: Sep. 15, 2016

(65) Prior Publication Data

US 2017/0255404 A1    Sep. 7, 2017

Related U.S. Application Data

(60) Provisional application No. 62/304,212, filed on Mar. 5, 2016.

(51) Int. Cl.
| | |
|---|---|
| *G06F 1/06* | (2006.01) |
| *G06F 13/42* | (2006.01) |
| *G06F 3/06* | (2006.01) |
| *G06F 12/00* | (2006.01) |

(52) U.S. Cl.
CPC ............ *G06F 1/06* (2013.01); *G06F 13/4243* (2013.01); *G06F 3/06* (2013.01); *G06F 12/00* (2013.01); *Y02D 10/14* (2018.01); *Y02D 10/151* (2018.01)

(58) Field of Classification Search
CPC ................................ G06F 13/00; G06F 12/02
See application file for complete search history.

(56) References Cited

U.S. PATENT DOCUMENTS

| | | | | |
|---|---|---|---|---|
| 9,460,791 | B1* | 10/2016 | Shallal | ..................... G11C 7/08 |
| 2003/0088735 | A1* | 5/2003 | Busser | .................. G06F 11/201 |
| | | | | 711/114 |
| 2009/0327792 | A1 | 12/2009 | Salmon et al. | |
| 2012/0047334 | A1 | 2/2012 | Qawami et al. | |
| 2013/0046923 | A1* | 2/2013 | Frank | ...................... G11C 5/04 |
| | | | | 711/105 |
| 2013/0322162 | A1 | 12/2013 | Lee et al. | |
| 2014/0006729 | A1 | 1/2014 | Cox et al. | |

FOREIGN PATENT DOCUMENTS

KR    20060023677 A    3/2006

OTHER PUBLICATIONS

International Search Report and Written Opinion for PCT Patent Application No. PCT/US2017/013660, dated Apr. 19, 2017, 12 pages.

* cited by examiner

*Primary Examiner* — Ajay Ojha
(74) *Attorney, Agent, or Firm* — Compass IP Law PC (57) ABSTRACT

Techniques to include a mirror of a command/address at a memory device. Techniques to also include interpretation of command/address logic. A memory device located on a dual in-line memory module (DIMM) includes circuitry having logic capable of receiving a command/address signal and mirror a command/address or interpret command/address logic indicated in the command/address signal based on one or more strap pins for the memory device.

20 Claims, 10 Drawing Sheets

System 100

Pin Diagram 400

|   | 1 | 2 | 3 | 4 | 5 | 6 | 7 | 8 | 9 |   |
|---|---|---|---|---|---|---|---|---|---|---|
| A | VDD | VSSQ | DQS_c |   |   |   | DQS_c | VSSQ | VSS | 1 |
| B | VPP | VDDQ | DQS_t |   |   |   | DQ1 | VDDQ | ZQ | 2 |
| C | VDDQ | DQ0 | DQS_t |   |   |   | VDD | VSS | VDDQ | 3 |
| D | VSSQ | DQ4 NC | DQ1 |   |   |   | DQ2 | DQS NC | VSSQ | 4 |
| E | VSS | VDDQ | DQ6 NC |   |   |   | DQ7 NC | VDDQ | VSS | 5 |
| F | RFU | MIRROR | CS0 |   |   |   | CS1 | CK_c | VPP | 6 |
| G | VSSQ | CAI | CA12 |   |   |   | CA13 | CK_t | VSSQ | 7 |
| H | VDDQ | VDD | CA10 |   |   |   | CA11 | VDD | VDDQ | 8 |
| J | VSSQ | NC/NB | CA8 |   |   |   | CA9 | NC/NB | VSSQ | 9 |
| K | VDDQ | VSS | CA6 |   |   |   | CA7 | VSS | VDDQ | 10 |
| L | VSSQ | NC/NB | CA4 |   |   |   | CA5 | NC/NB | VSSQ | 11 |
| M | VDDQ | VDD | CA2 |   |   |   | CA3 | VDD | VDDQ | 12 |
| N | VSSQ | ALERT_n VMON | CA0 |   |   |   | CA1 | RESET_N | VSSQ | 13 |

RECEIVE A COMMAND/ADDRESS SIGNAL INDICATING A FIRST COMMAND/ADDRESS TO A TARGET MEMORY DEVICE OF A FIRST SIDE OF A DIMM
702

DETERMINE BASED ON A STRAP PIN OF THE TARGET MEMORY DEVICE THAT THE FIRST COMMAND/ADDRESS INDICATED IN THE COMMAND/ADDRESS SIGNAL IS TO BE MIRRORED
704

MIRROR THE FIRST COMMAND/ADDRESS TO THE TARGET MEMORY DEVICE SUCH THAT THE FIRST COMMAND/ADDRESS INDICATED IN THE COMMAND/ADDRESS SIGNAL IS A MIRROR OF A SECOND COMMAND/ADDRESS TO A NON-TARGET MEMORY DEVICE ON A SECOND SIDE OF THE DIMM
706

- RECEIVE A COMMAND/ADDRESS SIGNAL AT A MEMORY DEVICE ON A DIMM
  *802*

- DETERMINE BASED ON A STRAP PIN OF THE MEMORY DEVICE WHETHER COMMAND/ADDRESS LOGIC INDICATED BY THE COMMAND/ADDRESS SIGNAL HAS BEEN INVERTED
  *804*

- INTERPRET THE COMMAND/ADDRESS LOGIC INDICATED BY THE COMMAND/ADDRESS SIGNAL BASED ON THE DETERMINATION THAT THE COMMAND/ADDRESS LOGIC INDICATED IN THE COMMAND/ADDRESS SIGNAL HAS BEEN INVERTED
  *806*

*FIG. 8*

Storage Medium 900

Computer Executable Instructions for 700

Computer Executable Instructions for 800

TECHNIQUES TO MIRROR A COMMAND/ADDRESS OR INTERPRET COMMAND/ADDRESS LOGIC AT A MEMORY DEVICE

RELATED CASE

This application claims priority to U.S. Provisional Patent Application No. 62/304,212 filed on Mar. 5, 2016 that is hereby both incorporated by reference in its entirety.

TECHNICAL FIELD

Examples described herein are generally related to memory devices on a dual in-line memory module (DIMM).

BACKGROUND

Memory modules coupled with computing platforms or systems such as those configured as a server may include dual in-line memory modules (DIMMs). DIMMs may include various types of memory including volatile or non-volatile types of memory. As memory technologies have advanced to include memory cells having higher and higher densities, memory capacities for DIMMs have also substantially increased. Also, advances in data rates for accessing data to be written to or read from memory included in a DIMM enable large amounts of data to flow between a requestor needing access and memory devices included in the DIMM. Higher data rates may result in increased frequencies for signals transmitted to/from memory included at the DIMM.

DETAILED DESCRIPTION

As contemplated by the present disclosure, higher data rates for accessing data to be written to or read from memory or memory devices at a DIMM may result in increased frequencies for signals transmitted to/from memory devices at the DIMM. Techniques to improve signal integrity as well as save power to include command/address signal mirroring or inversion may be implemented.

In some examples, memory buses transmitting data via increased frequencies may perform best when an interconnection stub between memory devices on opposite sides of a DIMM are minimized or made as short as possible. Some existing DIMMs may use a special "mirror" package or endure a long stub and the associated suboptimal signal routing. Other DIMMs may handle this by not using a different mirrored package. Rather, these other DIMMs may perform mirroring of command/addresses for pins of a memory device that can be swapped without changing functionality. For example, pins that may be purely for address bits. Pins for command bits, for instance, may not be swapped. The same may occur for this type of swapping for inversion of command/address signals. This may substantially limit the number of pins available for mirroring.

Also, in some examples for how current computing systems implement inversion with memory devices at DIMMs, a memory controller may use multiple command cycles during initialization. A first cycle may be issued normally, and second cycle may be to issue a copy of the same command with the logic inverted. This may place very complex requirements on the host memory controller to flip or invert bits.

Figure 1:
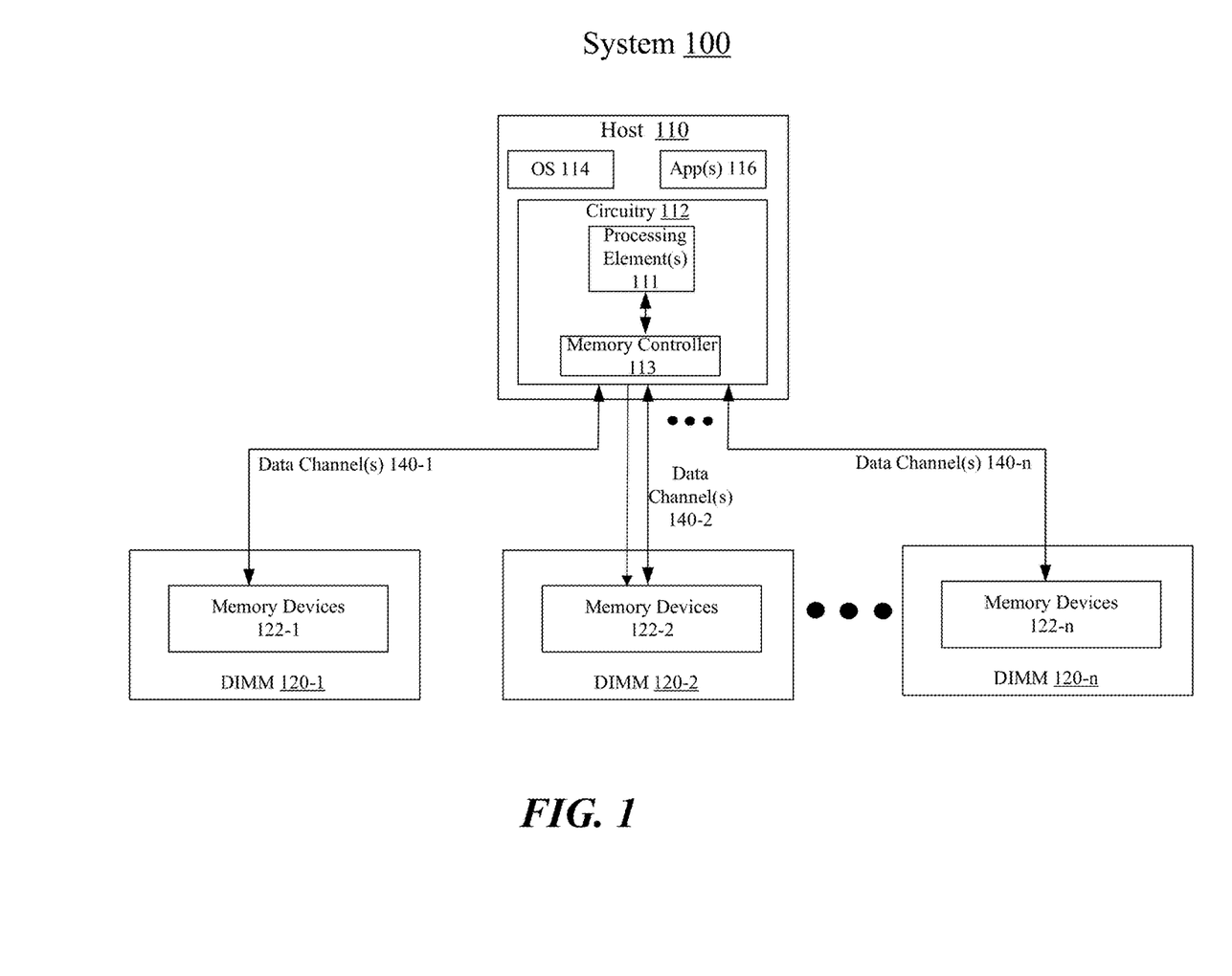
FIG. 1 illustrates an example system.

FIG. 1 illustrates a system 100. In some examples, as shown in FIG. 1, system 100 includes a host 110 coupled to DIMMs 120-1 to 120-n, where "n" is any positive whole integer with a value greater than 2. For these examples, DIMMs 120-1 to 120-n may be coupled to host 110 via one or more channels 140-1 to 140-n. As shown in FIG. 1, host 110 may include an operating system (OS) 114 one or more applications (App(s)) 116 and circuitry 112. Circuitry 112 may include one or more processing element(s) 111 (e.g., processors or processor cores) coupled with a memory controller 113. Host 110 may include, but is not limited to, a personal computer, a desktop computer, a laptop computer, a tablet, a server, a server array or server farm, a web server, a network server, an Internet server, a work station, a mini-computer, a main frame computer, a supercomputer, a network appliance, a web appliance, a distributed computing system, multiprocessor systems, processor-based systems, or combination thereof.

In some examples, as shown in FIG. 1, DIMMs 120-1 to 120-n may include respective memory dies or devices 120-1 to 120-n. Memory devices 120-1 to 120-n may include various types of volatile and/or non-volatile memory. Volatile memory may include, but is not limited to, random-access memory (RAM), Dynamic RAM (D-RAM), double data rate synchronous dynamic RAM (DDR SDRAM), static random-access memory (SRAM), Thyristor RAM (T-RAM) or zero-capacitor RAM (Z-RAM). Non-volatile memory may include, but is not limited to, non-volatile types of memory such as 3-Dimensional (3-D) cross-point memory that are byte or block addressable. These block addressable or byte addressable non-volatile types of memory for memory devices 120-1 to 120-n may include, but are not limited to, memory that uses chalcogenide phase change material (e.g., chalcogenide glass), multi-threshold level NAND flash memory, NOR flash memory, single or multi-level phase change memory (PCM), resistive memory, nanowire memory, ferroelectric transistor random access memory (FeTRAM), magnetoresistive random access memory (MRAM) memory that incorporates memristor technology, or spin transfer torque MRAM (STT-MRAM), or a combination of any of the above, or other non-volatile memory types.

According to some examples, memory devices 122-1 to 122-n including volatile and/or non-volatile types of memory may operate in accordance with a number of memory technologies, such as new technologies associated with DIMMs being developed that include, but are not limited to, DDR5 (DDR version 5, currently in discussion by JEDEC), LPDDR5 (LPDDR version 5, currently in discussion by JEDEC), HBM2 (HBM version 2, currently in discussion by JEDEC), and/or other new technologies based on derivatives or extensions of such specifications. Memory devices 122-1 to 122-n may also operate in accordance with other memory technologies such as, but are not limited to, DDR4 (double data rate (DDR) version 4, initial specification published in September 2012 by JEDEC), LPDDR4 (LOW POWER DOUBLE DATA RATE (LPDDR) version 4, JESD209-4, originally published by JEDEC in August 2014), WIO2 (Wide I/O 2 (WideIO2), JESD229-2, originally published by JEDEC in August 2014), HBM (HIGH BANDWIDTH MEMORY DRAM, JESD235, originally published by JEDEC in October 2013), and/or other technologies based on derivatives or extensions of these specifications.

According to some examples, DIMMs 120-1 to 120-n may be designed to function as a registered DIMM (RDIMM), a load reduced DIMM (LRDIMM), a low power DIMM (LPDIMM), a fully-buffered DIMM (FB-DIMM), an unbuffered DIMM (UDIMM) or a small outline (SODIMM). Examples are not limited to only these DIMM designs.

In some examples, memory devices 122-1 to 122-n at DIMMs 120-1 to 120-n may include all or combinations of types of volatile or non-volatile memory. For example, memory devices 122-1 at DIMM 120-1 may include volatile memory (e.g., DRAM) on a front or first side and may include non-volatile memory (e.g., 3D cross point memory) on a back or second side. In other examples, a hybrid DIMM may include combinations of non-volatile and volatile types of memory for memory devices 122-1 on either side of DIMM 120-1. In other examples, all memory devices 122-1 may be either volatile types of memory or non-volatile types of memory. In some examples, multiple channels may be coupled with memory devices maintained on a DIMM and in some examples, separate channels may be routed to different non-volatile/volatile types and/or groups of memory devices. For example, a first channel to memory devices including non-volatile memory and a second channel to memory devices including volatile memory. In other examples, a first channel may be routed to memory devices on a first side of a DIMMs and a second channel to memory devices on a second side of the DIMMs. Examples are not limited to the above examples of how multiple channels may be routed to memory devices included on a single DIMMs.

Figure 2:
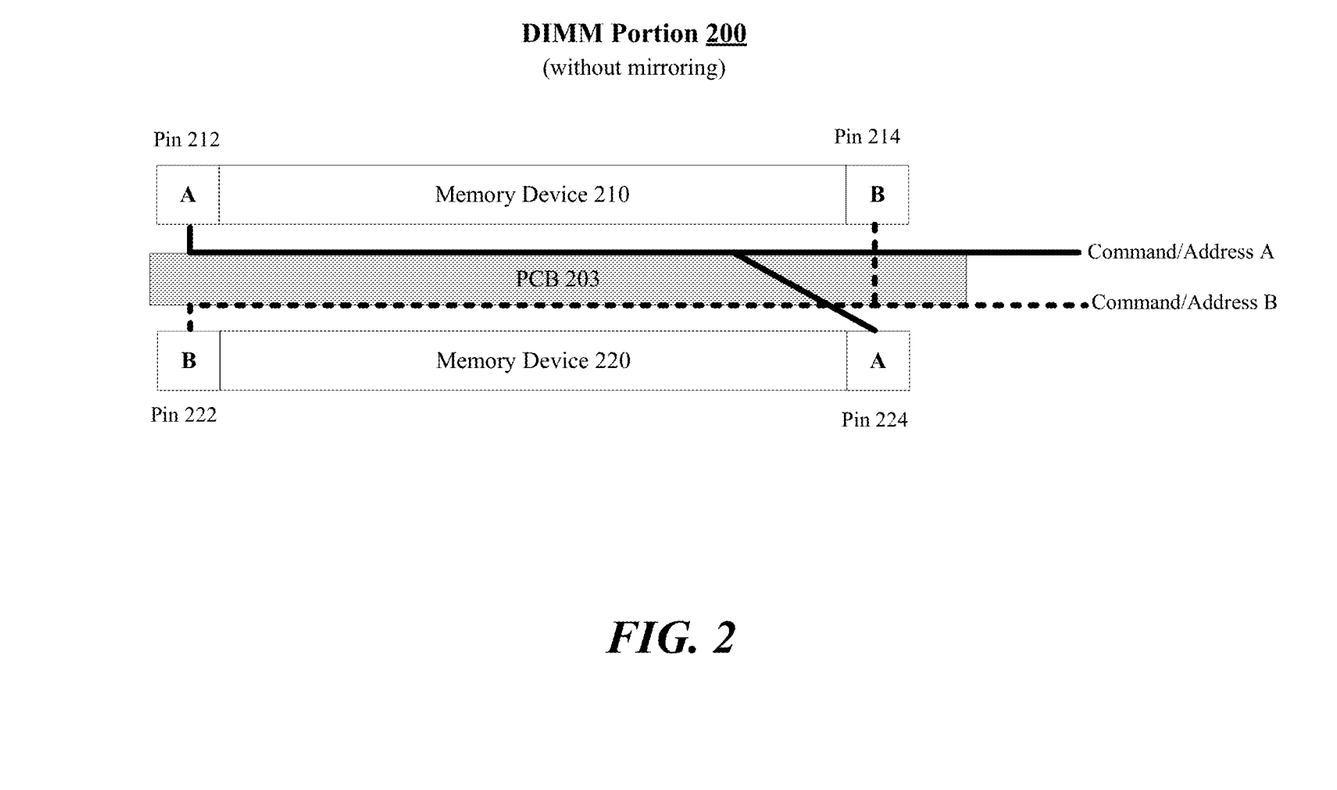
FIG. 2 illustrates an example first portion of a dual in-line memory module (DIMM).

FIG. 2 illustrates an example DIMM portion 200. In some examples, DIMM portion 200 shows how a double sided memory module assembly may have memory devices or dies 201 and 202 on opposites of a printed circuit board (PCB) 203 and share common address buses for command/address buses A and B. For these examples, pins 212 and 214 on memory device 201 becomes a mirror image of the pins 222 and 224 on memory device 202 for the common command/address buses A and B.

In some examples, a stub resulting from connections between mirrored or identical pins on either side of PCT 203, depicted by letters A and B in FIG. 2, may consume PCB routing resources and may impact bus frequency scaling. As described more below, techniques to implement mirroring may reduce a length of this stub. However, DIMM portion 200 shows an example of when mirroring is not implemented.

Figure 3:
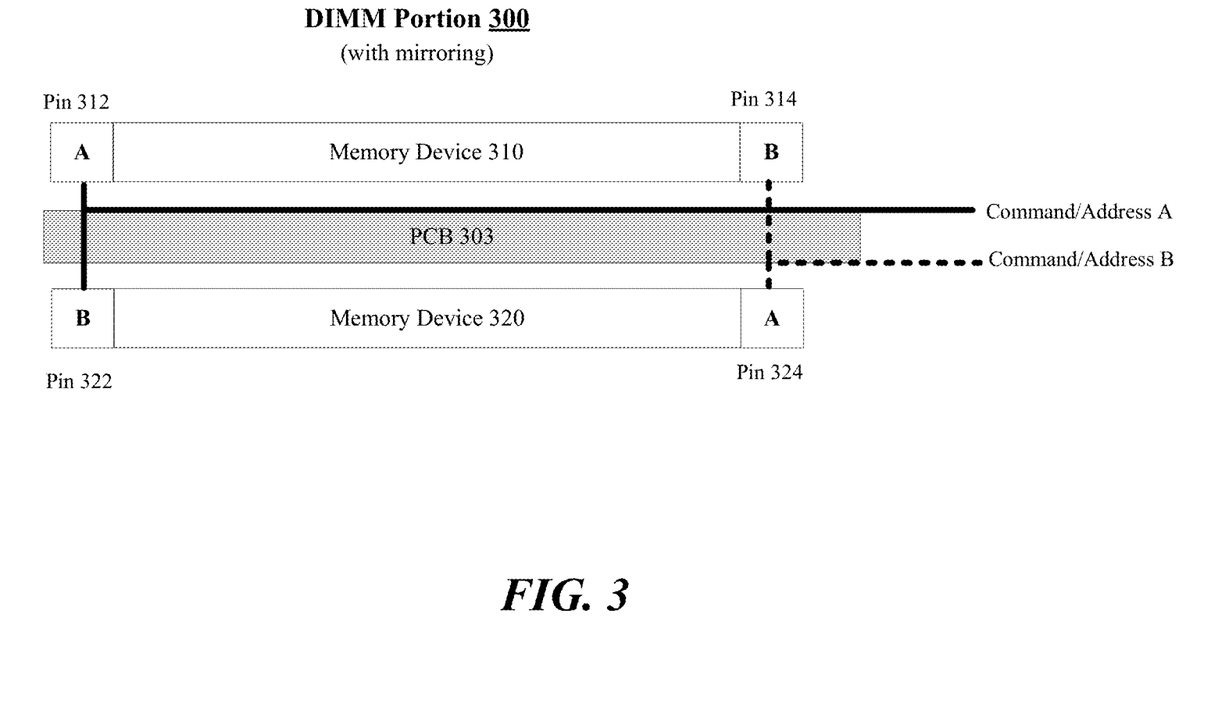
FIG. 3 illustrates an example second portion of a DIMM.

FIG. 3 illustrates an example DIMM portion 300. In some examples, command/address signals may be swapped at a target memory device such that the command/address signals may be coincident between memory devices on opposite sides of PCB 303. As a result, a common via through PCB 303 may be shared as shown in FIG. 3. A command/address signal such as command/address A may now be connected to pin 322 of memory device 320 and may also be connected to pin 312 of memory device 310 to form a shortest path or stub between these memory devices that is routed through PCB 303. As described more below, a strap pin may be utilized on a given memory device to indicate that a given command/address pin has been mirrored. For example, a first command/address to memory device 320 indicated in a command/address signal received via command/address A at pin 322 may be mirror of a second command/address to memory device 310 at pin 312 or vice versa.

According to some examples, a DIMM may use circuitry or logic at a register buffer (not shown) to produce additional copies of the command/address bus to reduce bus loading. For these examples, logic and/or circuitry at the register buffer may cause multiple bus segments routed from the register buffer to memory devices on the DIMM to propagate command/address signals. The propagated command/address signals may indicate respective command/address logic having logic levels inverted with respect to each other. Inversion of logic levels indicated in these propagated command/address signals may improve power efficiency and signal integrity. However, circuitry and/or logic at a memory device and/or at the register buffer needs to be aware that command/address logic indicated in command/address signals have been inverted. In some examples, another strap pin or bit may be utilized such that the memory device and/or logic at the register buffer can un-invert the command/address logic indicated in command/address signals for correct command/address logic interpretation.

Figure 4:
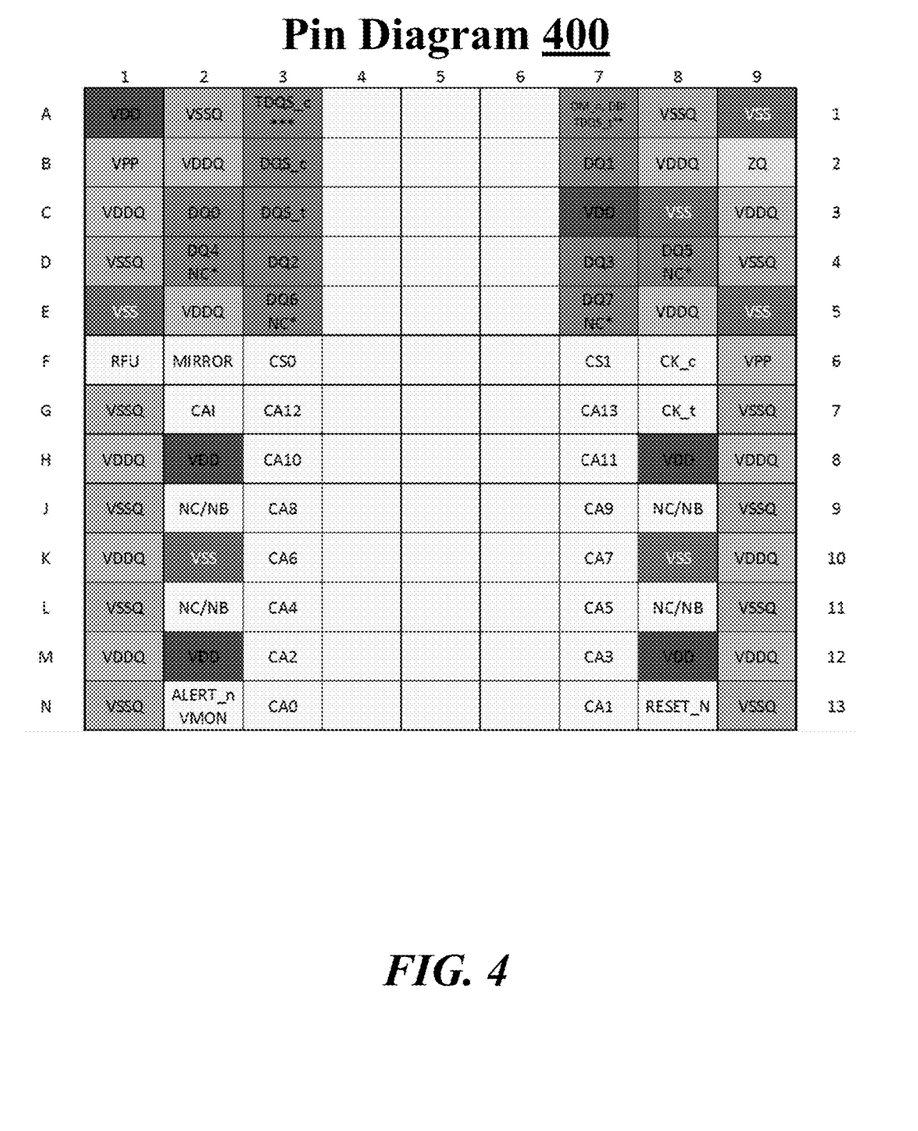
FIG. 4 illustrates an example pin diagram.

FIG. 4 illustrates an example pin diagram 400. In some examples, pin diagram 400 may be for a memory device having DRAM included on a DIMM. For these examples, strap pins indicated in pin diagram 400 in box F2 (Mirror) and G2 (CAI) may indicate whether the memory device should mirror command/addresses indicated in command/address signals and/or interpret command/address logic indicated in received command/address signals as being inverted.

According to some examples, a MIRROR pin (F2) of a targeted memory device designed according to pin diagram 400 may be connected to a power pin such as an output storage drain power voltage (VDDQ) pin (e.g. H1). For these examples, the targeted memory device may internally swap even numbered command/addresses (CAs) with the next higher respective odd numbered CAs in order to mirror a given CA to a targeted memory device. Example swapping pairs to mirror the given CA according to pin diagram 400 may include swapping CA2 with CA3 (not CA1), CA4 with CA5 (not CA3), CA6 with CA7 (not CA5), etc. In some examples, the MIRROR pin may be tied or connected to a ground pin such as a VSSQ pin (e.g., G1) if no CA swap is required or needed.

In some examples, with the CAI (Command Address Inversion) pin connected to a VDDQ (e.g., H1), a memory device designed to use a pin diagram such as pin diagram 400 may internally invert the command/address logic level indicated in received command/address signals (e.g., routed from a register buffer). According to some examples, the CAI pin may be connected or tied to a ground pin such as a VSSQ pin (e.g., H1) if the command/address logic is not to be interpreted as being inverted.

The two independent strap pins of MIRROR and CAI may allow for four different combinations that may include [no mirror, no inversion], [no mirror, inversion], [mirror, no inversion], or [mirror, inversion].

Figure 5:
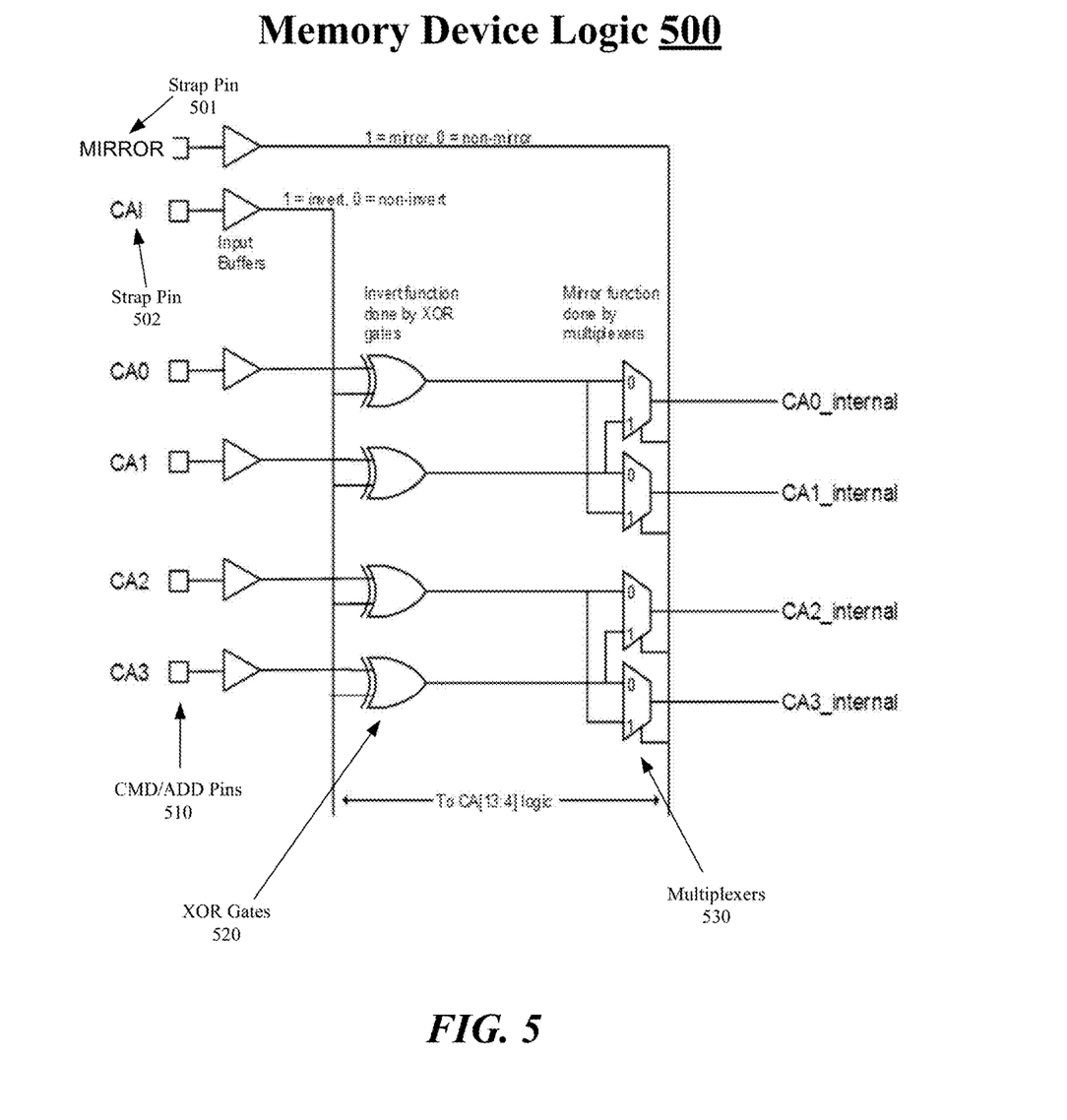
FIG. 5 illustrates an example memory device logic.

FIG. 5 illustrates an example memory device logic 500. In some examples, as shown in FIG. 5, circuitry of memory device logic 500 may be activated based on whether one or both of a strap pin 501 for MIRROR or a strap pin 502 for CAI have been connected to a power/VDDQ pin (results in 1) or connected to a ground/VSSQ pin (results in 0). As shown in FIG. 5, if a logic 1 is produced from strap pin 501, a memory device including memory device logic 500 may flip command/address signals received through CMD/ADD pins 510 (for command/addresses CA0 to CA13) via use of multiplexers 530. Also, if a logic 1 is produced from strap pin 502, a memory device including memory device logic 500 may invert command/address logic indicated in command/address signals received through CMD/ADD pins 510 (for command/addresses CA0 to CA13) via use of XOR gates 520.

Figure 6:
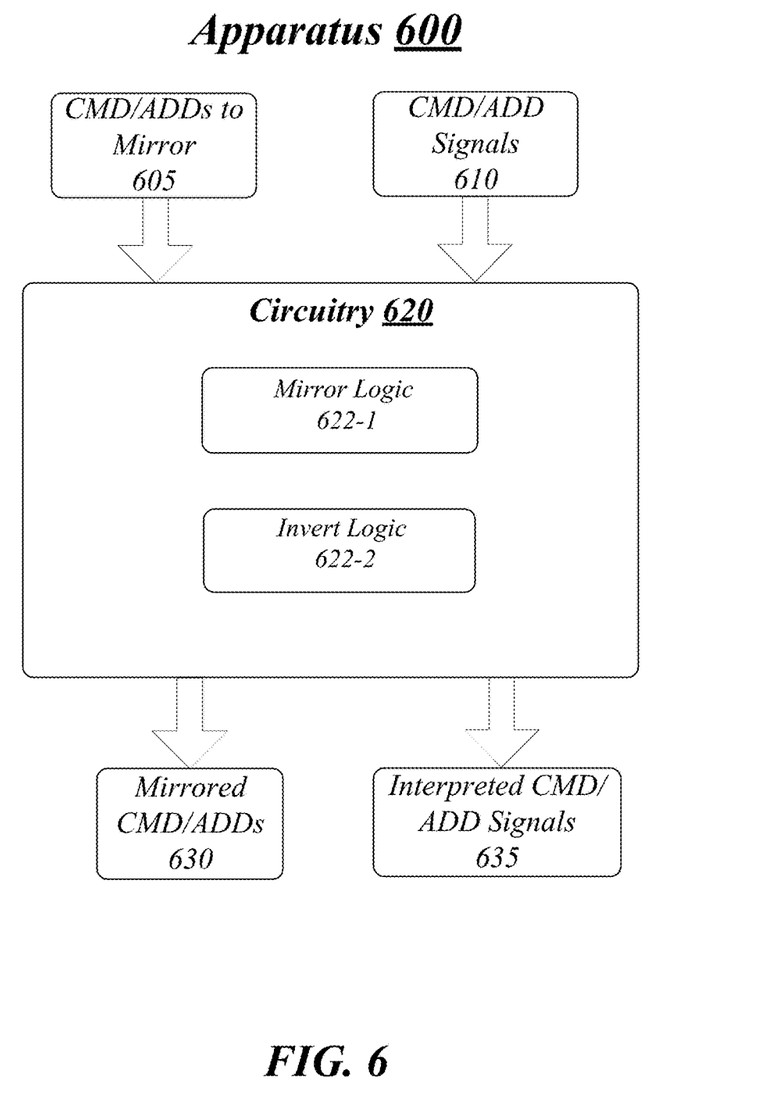
FIG. 6 illustrates an example apparatus.

FIG. 6 illustrates an example block diagram for an apparatus 600. Although apparatus 600 shown in FIG. 6 has a limited number of elements in a certain topology, it may be appreciated that the apparatus 600 may include more or less elements in alternate topologies as desired for a given implementation.

The apparatus 600 may be supported by circuitry 620 maintained or located at a memory device on a DIMM coupled with a host via one or more channels. Circuitry 620 may be arranged to execute one or more software or firmware implemented components or logic 622-*a*. It is worthy to note that "a" and "b" and "c" and similar designators as used herein are intended to be variables representing any positive integer. Thus, for example, if an implementation sets a value for a=3, then a complete set of software or firmware for components or logic 622-*a* may include components or logic 622-1 or 622-2. The examples presented are not limited in this context and the different variables used throughout may represent the same or different integer values. Also, these "components" or "logic" may be software/firmware stored in computer-readable media, and although the components are shown in FIG. 6 as discrete boxes, this does not limit these components to storage in distinct computer-readable media components (e.g., a separate memory, etc.).

According to some examples, circuitry 620 may include a processor or processor circuitry. The processor or processor circuitry can be any of various commercially available processors, including without limitation an AMD® Athlon®, Duron® and Opteron® processors; ARM® application, embedded and secure processors; IBM® and Motorola® DragonBall® and PowerPC® processors; IBM and Sony® Cell processors; Intel® Atom®, Celeron®, Core (2) Duo®, Core i3, Core i5, Core i7, Itanium®, Pentium®, Xeon®, Xeon Phi® and XScale® processors; and similar processors. According to some examples circuitry 620 may also be an application specific integrated circuit (ASIC) and at least some components or logic 622-*a* may be implemented as hardware elements of the ASIC.

According to some examples, apparatus 600 may include a mirror logic 622-1. Mirror logic 622-1 may be executed by circuitry 620 to receive a first command/address signal indicating a first command/address to a target memory device that may include apparatus 600. The target memory device may be located on a first side of a DIMM. The command/address signal may be included in CMD/ADDs to mirror 605. Mirror logic 622-1 may then mirror the first command/address such that the first command/address indicated in the command/address signal is a mirror of a second command/address to a memory device on a second side of the DIMM. The mirror command/address may be included in mirrored CMD/ADDs 630.

In some examples, apparatus 600 may also include an invert logic 622-2. Invert logic 622-2 may be executed by circuitry 620 to receive a command/address signal at the memory device that includes apparatus 600. Invert logic 622-2 may determine based on a strap pin of the memory device whether command/address logic indicated by the command/address signal has been inverted and then interpret the command/address logic indicated by the command/address signal based on the determination. The inverted command/address logic may be included in CMD/ADD signals 610 and the interpreted command/address logic may be included in interpreted CMD/ADD logic 635.

Figure 7:
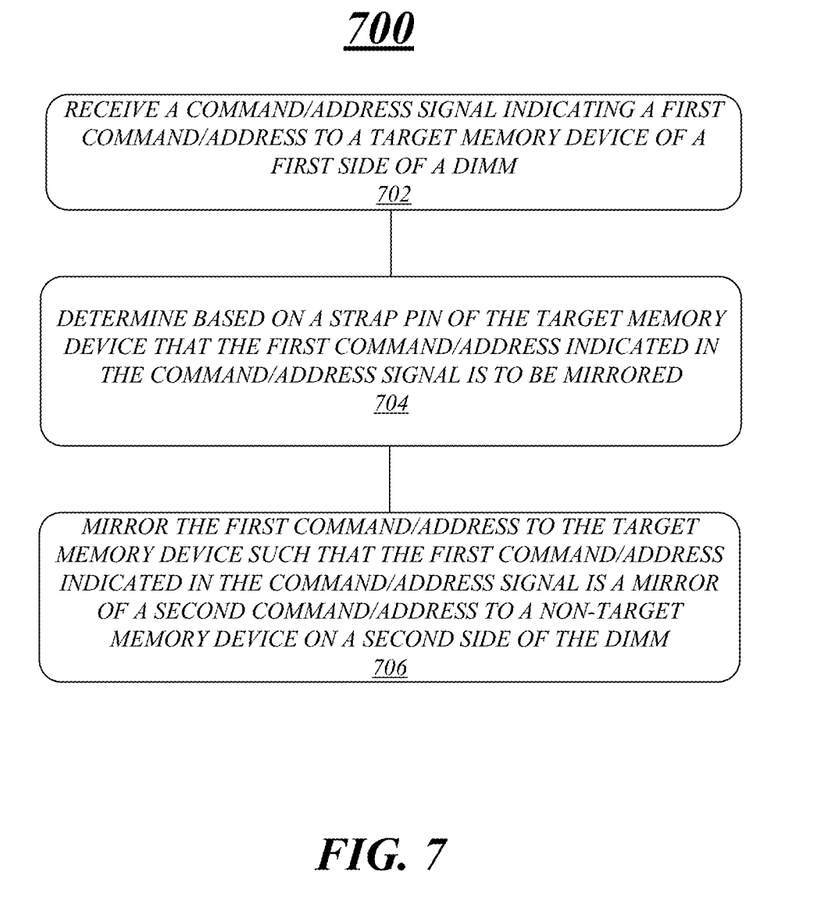
FIG. 7 illustrates an example first logic flow.

FIG. 7 illustrates an example logic flow 700. As shown in FIG. 7 the first logic flow includes a logic flow 700. Logic flow 700 may be representative of some or all of the operations executed by one or more logic, features, or devices described herein, such as apparatus 700. More particularly, logic flow 700 may be implemented by mirror logic 622-1.

According to some examples, logic flow 700 at block 702 may receive a command/address signal indicating a first command/address to a target memory device on a first side of a DIMM. For these examples, mirror logic 622-1 may receive the command/address signal.

In some examples, logic flow 700 at block 704 may determine based on a strap pin of the target memory device that the first command/address indicated in the command/address signal is to be mirrored. For these examples, mirror logic 622-2 may make this determination.

According to some examples, logic flow 700 at block 706 may mirror the first command/address to the target memory device such that the first command/address indicated in the command/address signal is a mirror of a second command/address to a non-target memory device on a second side of the DIMM. For these examples, mirror logic 622-1 may mirror the first command/address to the target memory device.

Figure 8:
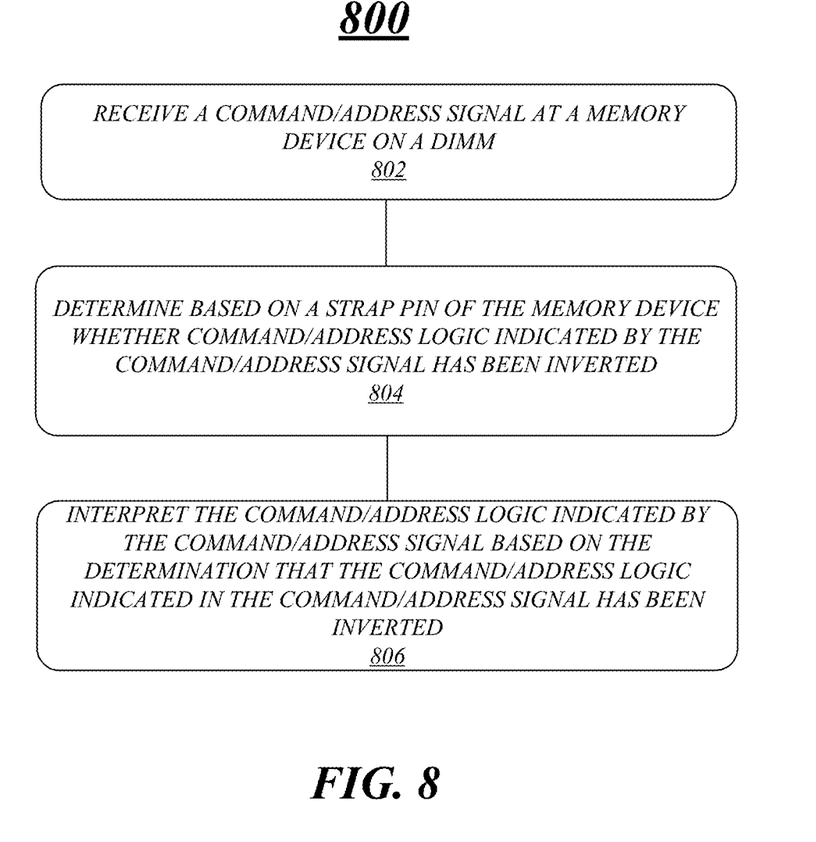
FIG. 8 illustrates an example first logic flow.

FIG. 8 illustrates an example logic flow 800. As shown in FIG. 8 the first logic flow includes a logic flow 800. Logic flow 800 may be representative of some or all of the operations executed by one or more logic, features, or devices described herein, such as apparatus 800. More particularly, logic flow 800 may be implemented by invert logic 622-1.

According to some examples, logic flow 800 at block 802 may receive a command/address signal at a memory device on a DIMM. For these examples, invert logic 622-1 may receive the command/address signal.

In some examples, logic flow 800 at block 804 may determine based on a strap pin of the memory device whether command/address logic indicated by the command/address signal has been inverted. For these examples, invert logic 822-2 may determine whether the command/address logic has been inverted.

According to some examples, logic flow 800 at block 806 may interpret the command/address logic indicated by the command/address signal based on the determination that the command/address logic indicated in the command/address signal has been inverted. For these examples, invert logic 822-2 may interpret the command/address logic based on the determination.

Figure 9:
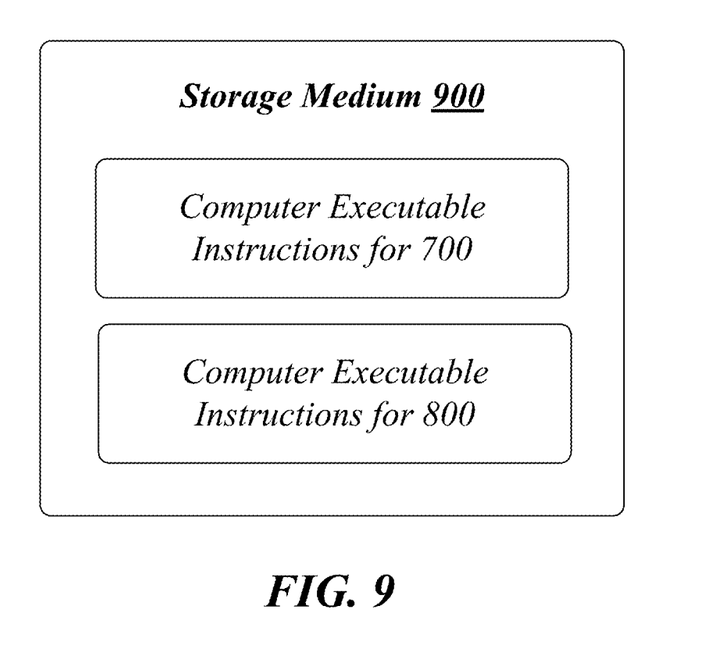
FIG. 9 illustrates an example storage medium.

FIG. 9 illustrates an example storage medium 900. As shown in FIG. 9, the first storage medium includes a storage medium 900. The storage medium 900 may comprise an article of manufacture. In some examples, storage medium 900 may include any non-transitory computer readable medium or machine readable medium, such as an optical, magnetic or semiconductor storage. Storage medium 900 may store various types of computer executable instructions, such as instructions to implement logic flow 700 or 800. Examples of a computer readable or machine readable storage medium may include any tangible media capable of storing electronic data, including volatile memory or non-volatile memory, removable or non-removable memory, erasable or non-erasable memory, writeable or re-writeable memory, and so forth. Examples of computer executable instructions may include any suitable type of code, such as source code, compiled code, interpreted code, executable code, static code, dynamic code, object-oriented code, visual code, and the like. The examples are not limited in this context.

Figure 10:
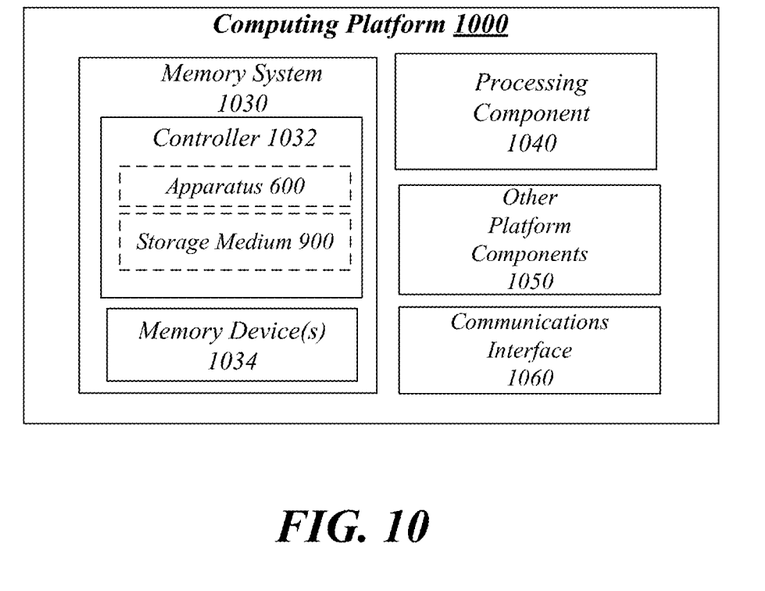
FIG. 10 illustrates an example computing platform.

FIG. 10 illustrates an example computing platform 1000. In some examples, as shown in FIG. 10, computing platform 1000 may include a memory system 1030, a processing component 1040, other platform components 1050 or a communications interface 1060. According to some examples, computing platform 1000 may be implemented in a computing device.

According to some examples, memory system 1030 may include a controller 1032 and memory devices(s) 1034. For these examples, logic and/or features resident at or located at controller 1032 may execute at least some processing operations or logic for apparatus 600 and may include storage media that includes storage medium 900. Also, memory device(s) 1034 may include similar types of volatile or non-volatile memory (not shown) that are described above for memory devices 122, 210, 220, 310 or 320 shown in FIGS. 1-3. In some examples, controller 1032 may be part of a same die with memory device(s) 1034. In other examples, controller 1032 and memory device(s) 1034 may be located on a same die or integrated circuit with a processor (e.g., included in processing component 1040). In yet other examples, controller 1032 may be in a separate die or integrated circuit coupled with or on memory device(s) 1034.

According to some examples, processing component 1040 may include various hardware elements, software elements, or a combination of both. Examples of hardware elements may include devices, logic devices, components, processors, microprocessors, circuits, processor circuits, circuit elements (e.g., transistors, resistors, capacitors, inductors, and so forth), integrated circuits, ASIC, programmable logic devices (PLD), digital signal processors (DSP), FPGA/programmable logic, memory units, logic gates, registers, semiconductor device, chips, microchips, chip sets, and so forth. Examples of software elements may include software components, programs, applications, computer programs, application programs, system programs, software development programs, machine programs, operating system software, middleware, firmware, software modules, routines, subroutines, functions, methods, procedures, software interfaces, APIs, instruction sets, computing code, computer code, code segments, computer code segments, words, values, symbols, or any combination thereof. Determining whether an example is implemented using hardware elements and/or software elements may vary in accordance with any number of factors, such as desired computational rate, power levels, heat tolerances, processing cycle budget, input data rates, output data rates, memory resources, data bus speeds and other design or performance constraints, as desired for a given example.

In some examples, other platform components 1050 may include common computing elements, such as one or more processors, multi-core processors, co-processors, memory units, chipsets, controllers, peripherals, interfaces, oscillators, timing devices, video cards, audio cards, multimedia I/O components (e.g., digital displays), power supplies, and so forth. Examples of memory units associated with either other platform components 1050 or storage system 1030 may include without limitation, various types of computer readable and machine readable storage media in the form of one or more higher speed memory units, such as read-only memory (ROM), RAM, DRAM, DDR DRAM, synchronous DRAM (SDRAM), DDR SDRAM, SRAM, programmable ROM (PROM), EPROM, EEPROM, flash memory, ferroelectric memory, SONOS memory, polymer memory such as ferroelectric polymer memory, nanowire, FeTRAM or FeRAM, ovonic memory, phase change memory, memristers, STT-MRAM, magnetic or optical cards, and any other type of storage media suitable for storing information.

In some examples, communications interface 1060 may include logic and/or features to support a communication interface. For these examples, communications interface 1060 may include one or more communication interfaces that operate according to various communication protocols or standards to communicate over direct or network communication links. Direct communications may occur through a direct interface via use of communication protocols or standards described in one or more industry standards (including progenies and variants) such as those associated with the SMBus specification, the PCIe specification, the NVMe specification, the SATA specification, SAS specification or the USB specification. Network communications may occur through a network interface via use of communication protocols or standards such as those described in one or more Ethernet standards promulgated by the IEEE. For example, one such Ethernet standard may include IEEE 802.3-2012, Carrier sense Multiple access with Collision Detection (CSMA/CD) Access Method and Physical Layer Specifications, Published in December 2012 (hereinafter "IEEE 802.3").

Computing platform 1000 may be part of a computing device that may be, for example, user equipment, a computer, a personal computer (PC), a desktop computer, a laptop computer, a notebook computer, a netbook computer, a tablet, a smart phone, embedded electronics, a gaming console, a server, a server array or server farm, a web server, a network server, an Internet server, a work station, a mini-computer, a main frame computer, a supercomputer, a network appliance, a web appliance, a distributed computing system, multiprocessor systems, processor-based systems, or combination thereof. Accordingly, functions and/or specific configurations of computing platform 1000 described herein, may be included or omitted in various embodiments of computing platform 1000, as suitably desired.

The components and features of computing platform 1000 may be implemented using any combination of discrete circuitry, ASICs, logic gates and/or single chip architectures. Further, the features of computing platform 1000 may be implemented using microcontrollers, programmable logic arrays and/or microprocessors or any combination of the foregoing where suitably appropriate. It is noted that hardware, firmware and/or software elements may be collectively or individually referred to herein as "logic", "circuit" or "circuitry."

One or more aspects of at least one example may be implemented by representative instructions stored on at least one machine-readable medium which represents various logic within the processor, which when read by a machine, computing device or system causes the machine, computing device or system to fabricate logic to perform the techniques described herein. Such representations may be stored on a tangible, machine readable medium and supplied to various customers or manufacturing facilities to load into the fabrication machines that actually make the logic or processor.

Various examples may be implemented using hardware elements, software elements, or a combination of both. In some examples, hardware elements may include devices, components, processors, microprocessors, circuits, circuit elements (e.g., transistors, resistors, capacitors, inductors, and so forth), integrated circuits, ASICs, PLDs, DSPs, FPGAs, memory units, logic gates, registers, semiconductor device, chips, microchips, chip sets, and so forth. In some examples, software elements may include software components, programs, applications, computer programs, application programs, system programs, machine programs, operating system software, middleware, firmware, software modules, routines, subroutines, functions, methods, procedures, software interfaces, APIs, instruction sets, computing code, computer code, code segments, computer code segments, words, values, symbols, or any combination thereof. Determining whether an example is implemented using hardware elements and/or software elements may vary in accordance with any number of factors, such as desired computational rate, power levels, heat tolerances, processing cycle budget, input data rates, output data rates, memory resources, data bus speeds and other design or performance constraints, as desired for a given implementation.

Some examples may include an article of manufacture or at least one computer-readable medium. A computer-readable medium may include a non-transitory storage medium to store logic. In some examples, the non-transitory storage medium may include one or more types of computer-readable storage media capable of storing electronic data, including volatile memory or non-volatile memory, removable or non-removable memory, erasable or non-erasable memory, writeable or re-writeable memory, and so forth. In some examples, the logic may include various software elements, such as software components, programs, applications, computer programs, application programs, system programs, machine programs, operating system software, middleware, firmware, software modules, routines, subroutines, functions, methods, procedures, software interfaces, API, instruction sets, computing code, computer code, code segments, computer code segments, words, values, symbols, or any combination thereof.

According to some examples, a computer-readable medium may include a non-transitory storage medium to store or maintain instructions that when executed by a machine, computing device or system, cause the machine, computing device or system to perform methods and/or operations in accordance with the described examples. The instructions may include any suitable type of code, such as source code, compiled code, interpreted code, executable code, static code, dynamic code, and the like. The instructions may be implemented according to a predefined computer language, manner or syntax, for instructing a machine, computing device or system to perform a certain function. The instructions may be implemented using any suitable high-level, low-level, object-oriented, visual, compiled and/or interpreted programming language.

Some examples may be described using the expression "in one example" or "an example" along with their derivatives. These terms mean that a particular feature, structure, or characteristic described in connection with the example is included in at least one example. The appearances of the phrase "in one example" in various places in the specification are not necessarily all referring to the same example.

Some examples may be described using the expression "coupled" and "connected" along with their derivatives. These terms are not necessarily intended as synonyms for each other. For example, descriptions using the terms "connected" and/or "coupled" may indicate that two or more elements are in direct physical or electrical contact with each other. The term "coupled," however, may also mean that two or more elements are not in direct contact with each other, but yet still co-operate or interact with each other.

The follow examples pertain to additional examples of technologies disclosed herein.

Example 1

An example apparatus may include circuitry for a memory device on first side of a DIMM. The circuitry may include logic, at least a portion of which is hardware, the logic may receive a command/address signal that indicates a first command/address to the target memory device. The logic may also determine based on a strap pin of the memory device that the first command/address indicated in the command/address signal is to be mirrored. The logic may also mirror the first command/address to the memory device such that the first command/address indicated in the command/address signal is a mirror of a second command/address to a memory device on a second side of the DIMM.

Example 2

The apparatus of example 1, the logic to mirror the first command/address to the target memory device may include the logic to swap respective even numbered command/addresses to the target memory device with a respective next higher odd numbered command/addresses to the target memory device.

Example 3

The apparatus of example 1, the logic to determine based on the strap pin that the first command/address indicated in the command/address signal is the mirror of the second command/address includes the logic to determine that the strap pin is connected to a power pin of the target memory device.

Example 4

The apparatus of example 3, the power pin includes a VDDQ pin.

Example 5

The apparatus of example 1, the DIMM may be an RDIMM, an LPDIMM, a LRDIMM, a FB-DIMM, an UDIMM or a SODIMM.

Example 6

The apparatus of example 1, the memory device may include non-volatile memory or volatile memory.

Example 7

The apparatus of example 6, the volatile memory may be DRAM.

Example 8

The apparatus of example 6, the non-volatile memory may be 3-dimensional cross-point memory, memory that uses chalcogenide phase change material, multi-threshold level NAND flash memory, NOR flash memory, single or multi-level PCM, resistive memory, ovonic memory, nanowire memory, FeTRAM, MRAM memory that incorporates memristor technology, or STT-MRAM.

Example 9

An example method may include receiving, by circuitry at a target memory device on first side of a DIMM, a command/address signal indicating a first command/address to the target memory device. The method may also include determining based on a strap pin of the target memory device that the first command/address indicated in the command/address signal is to be mirrored. The method may also include mirroring the first command/address to the target memory device such that the first command/address indicated in the command/address signal is a mirror of a second command/address to a non-target memory device on a second side of the DIMM.

Example 10

The method of example 9, mirroring the first command/address to the target memory device may include swapping respective even numbered command/addresses to the target memory device with a respective next higher odd numbered command/addresses to the target memory device.

Example 11

The method of example 9, determining based on the strap pin that the first command/address indicated in the command/address signal is the mirror of the second command/address may include the strap pin being connected to a power pin of the target memory device.

Example 12

The method of example 11, the power pin may be a VDDQ pin.

Example 13

The method of example 9, the DIMM may be an RDIMM, an LPDIMM, a LRDIMM, a FB-DIMM, an UDIMM or a SODIMM.

Example 14

The method of example 9, the memory device may include non-volatile memory or volatile memory.

Example 15

The method of example 14, the volatile memory may be DRAM.

Example 16

The method of example 14, the non-volatile memory may be 3-dimensional cross-point memory, memory that uses chalcogenide phase change material, multi-threshold level NAND flash memory, NOR flash memory, single or multi-level PCM, resistive memory, ovonic memory, nanowire memory, FeTRAM, MRAM memory that incorporates memristor technology, or STT-MRAM.

Example 17

An example at least one machine readable medium may include a plurality of instructions that in response to being executed by a system may cause the system to carry out a method according to any one of examples 9 to 16.

Example 18

An example apparatus may include means for performing the methods of any one of examples 9 to 16.

Example 19

An example apparatus may include circuitry for a memory device on a first side of a DIMM, the circuitry including logic, at least a portion of which may be hardware, the logic may receive a command/address signal. The logic may also determine based on a strap pin of the memory device whether command/address logic indicated by the command/address signal has been inverted. The logic may also interpret the command/address logic indicated by the command/address signal based on the determination.

Example 20

The apparatus of example 19, the logic may determine that the command/address signal indicates that the command/address logic has been inverted based on the strap pin being connected to a power pin of the target memory device.

Example 21

The apparatus of example 20, the power pin may be a VDDQ pin.

Example 22

The apparatus of example 19, the command/address logic indicated by the command/address signal may be inverted by circuitry for a register buffer of the DIMM.

Example 23

The apparatus of example 19, the DIMM may be an RDIMM, an LPDIMM, a LRDIMM, a FB-DIMM, an UDIMM or a SODIMM.

Example 24

The apparatus of example 19, the memory device may include non-volatile memory or volatile memory.

Example 25

The apparatus of example 24, the volatile memory may be DRAM.

Example 26

The apparatus of example 24, the non-volatile memory may be 3-dimensional cross-point memory, memory that uses chalcogenide phase change material, multi-threshold level NAND flash memory, NOR flash memory, single or multi-level PCM, resistive memory, ovonic memory, nanowire memory, FeTRAM, MRAM memory that incorporates memristor technology, or STT-MRAM.

Example 27

An example method comprising may include receiving, by circuitry a target memory device on a DIMM, a command/address signal. The method may also include determining based on a strap pin of the memory device whether command/address logic indicated by the command/address signal has been inverted. The method may also include interpreting the command/address logic indicated by the command/address signal based on the determination.

Example 28

The method of example 27 may also include determining that the command/address signal indicates that the command/address logic has been inverted based on the strap pin being connected to a power pin of the target memory device.

Example 29

The method of example 28, the power pin may be a VDDQ pin.

Example 30

The method of example 27, the command/address logic indicated by the command/address signal may have been inverted by circuitry for a register buffer of the DIMM.

Example 31

The method of example 27, the DIMM may be an RDIMM, an LPDIMM, a LRDIMM, a FB-DIMM, an UDIMM or a SODIMM.

Example 32

The method of example 27, the memory device may include non-volatile memory or volatile memory.

Example 33

The method of example 32, the volatile memory may be DRAM.

Example 34

The method of example 32, the non-volatile memory may be 3-dimensional cross-point memory, memory that uses chalcogenide phase change material, multi-threshold level NAND flash memory, NOR flash memory, single or multi-level PCM, resistive memory, ovonic memory, nanowire memory, FeTRAM, MRAM memory that incorporates memristor technology, or STT-MRAM.

Example 35

An example at least one machine readable medium may include a plurality of instructions that in response to being executed by a system may cause the system to carry out a method according to any one of examples 27 to 34.

Example 36

An example apparatus may include means for performing the methods of any one of examples 27 to 34.

Example 37

An example system may include a DIMM including one or more first memory devices on a first side and one or more second memory devices on a second side. The system may also include a memory device from among the one or more first memory devices, the memory device having a first strap pin and including logic, at least a portion of which may be hardware. For these examples, the logic may receive a first command/address signal that indicates a first command/address targeted to the memory device. The logic may also determine whether the first strap pin is connected to a power pin. The logic may also mirror the first command/address targeted to the memory device based on the determination such that the first command/address indicated in the first command/address signal is a mirror of a second command/address to a memory device from among the one or more second memory devices on the second side of the DIMM.

Example 38

The system of example 37, the logic to mirror the first command/address to the memory device from among the first one or more memory devices may include the logic to swap respective even numbered command/addresses to the memory device from among the first one or more memory devices with a respective next higher odd numbered command/addresses to the memory device from among the first one or more memory devices.

Example 39

The system of example 37, the power pin may be a VDDQ pin.

Example 40

The system of example 37, the memory device from among the one or more first memory devices may have a second strap pin. For these examples, the memory device may further include logic that may receive a second command/address signal and interpret a command/address logic indicated by the second command/address signal based on the second strap pin being connected to a same or different power pin than what the first strap pin is connected to such that the command/address logic indicated by the second command/address signal is interpreted as being inverted.

Example 41

The system of example 40, the same or different power pin than what the first strap pin is connected to may be a same or different VDDQ pin.

Example 42

The system of example 40, the command/address logic indicated by the second command/address signal may have been inverted by circuitry for a register buffer of the DIMM.

Example 43

The system of example 37, the DIMM may be an RDIMM, an LPDIMM, a LRDIMM, a FB-DIMM, an UDIMM or a SODIMM.

Example 44

The system of example 37, the memory device may include non-volatile memory or volatile memory.

Example 45

The system of example 44, the volatile memory may be DRAM.

Example 46

The system of example 44, the non-volatile memory may be 3-dimensional cross-point memory, memory that uses chalcogenide phase change material, multi-threshold level NAND flash memory, NOR flash memory, single or multi-level PCM, resistive memory, ovonic memory, nanowire memory, FeTRAM, MRAM memory that incorporates memristor technology, or STT-MRAM.

It is emphasized that the Abstract of the Disclosure is provided to comply with 37 C.F.R. Section 1.72(b), requiring an abstract that will allow the reader to quickly ascertain the nature of the technical disclosure. It is submitted with the understanding that it will not be used to interpret or limit the scope or meaning of the examples. In addition, in the foregoing Detailed Description, it can be seen that various features are grouped together in a single example for the purpose of streamlining the disclosure. This method of disclosure is not to be interpreted as reflecting an intention that the claimed examples require more features than are expressly recited in each example. Rather, as the following examples reflect, inventive subject matter lies in less than all features of a single disclosed example. Thus the following examples are hereby incorporated into the Detailed Description, with each example standing on its own as a separate example. In the appended examples, the terms "including" and "in which" are used as the plain-English equivalents of the respective terms "comprising" and "wherein," respectively. Moreover, the terms "first," "second," "third," and so forth, are used merely as labels, and are not intended to impose numerical requirements on their objects.

Although the subject matter has been described in language specific to structural features and/or methodological acts, it is to be understood that the subject matter defined in the appended examples is not necessarily limited to the specific features or acts described above. Rather, the specific features and acts described above are disclosed as example forms of implementing the claims.

What is claimed is:

1. An apparatus comprising:
    circuitry for a memory device on first side of a dual in-line memory module (DIMM), the circuitry including logic, at least a portion of which comprises hardware, the logic to:
    receive a command/address signal that indicates a first command/address directed to the memory device;
    determine based on a strap pin of the memory device connected to a power pin of the memory device that the first command/address indicated in the command/address signal is to be mirrored; and
    mirror the first command/address directed to the memory device such that the first command/address indicated in the command/address signal is a mirror of a second command/address to a second memory device on a second side of the DIMM.

2. The apparatus of claim 1, the logic to mirror the first command/address to the memory device comprises the logic to swap respective even numbered command/addresses to the memory device with a respective next higher odd numbered command/addresses to the memory device.

3. The apparatus of claim 1, the power pin comprises an output storage drain power voltage (VDDQ) pin.

4. The apparatus of claim 1, the DIMM comprises a registered DIMM (RDIMM), a low power DIMM (LP-DIMM), a load reduced DIMM (LRDIMM), a fully-buffered DIMM (FB-DIMM), an unbuffered DIMM (UDIMM) or a small outline DIMM (SODIMM).

5. The apparatus of claim 1, comprising the memory device to include non-volatile memory or volatile memory.

6. The apparatus of claim 5, the volatile memory comprising dynamic random access memory (DRAM).

7. The apparatus of claim 5, the non-volatile memory comprising 3-dimensional cross-point memory, memory that uses chalcogenide phase change material, multi-threshold level NAND flash memory, NOR flash memory, single or multi-level phase change memory (PCM), resistive memory, ovonic memory, nanowire memory, ferroelectric transistor random access memory (FeTRAM), magnetoresistive random access memory (MRAM) memory that incorporates memristor technology, or spin transfer torque MRAM (STT-MRAM).

8. An apparatus comprising:
    circuitry for a memory device on a first side of a dual in line memory module (DIMM), the circuitry including logic, at least a portion of which comprises hardware, the logic to:
    receive a command/address signal;
    determine based on a strap pin of the memory device connected to a power pin of the memory device whether command/address logic indicated by the command/address signal has been inverted; and
    interpret the command/address logic indicated by the command/address signal based on the determination.

9. The apparatus of claim 8, the power pin comprises an output storage drain power voltage (VDDQ) pin.

10. The apparatus of claim 8, comprising the command/address logic indicated by the command/address signal was inverted by circuitry for a register buffer of the DIMM.

11. The apparatus of claim 8, the DIMM comprises a registered DIMM (RDIMM), a low power DIMM (LP-DIMM), a load reduced DIMM (LRDIMM), a fully-buffered DIMM (FB-DIMM), an unbuffered DIMM (UDIMM) or a small outline DIMM (SODIMM).

12. The apparatus of claim 8, comprising the memory device to include non-volatile memory or volatile memory, the volatile memory including dynamic random access memory (DRAM), the non-volatile memory including 3-dimensional cross-point memory, memory that uses chalcogenide phase change material, multi-threshold level NAND flash memory, NOR flash memory, single or multi-level phase change memory (PCM), resistive memory, ovonic memory, nanowire memory, ferroelectric transistor random access memory (FeTRAM), magnetoresistive random access memory (MRAM) memory that incorporates memristor technology, or spin transfer torque MRAM (STT-MRAM).

13. A system comprising:
    a dual in-line memory module (DIMM) including one or more first memory devices on a first side and one or more second memory devices on a second side; and
    a memory device from among the one or more first memory devices, the memory device having a first strap pin and including logic, at least a portion of which comprises hardware, the logic to:
    receive a first command/address signal that indicates a first command/address directed to the memory device;
    determine whether the first strap pin is connected to a power pin of the memory device; and mirror the first command/address targeted to the memory device based on the determination such that the first command/address indicated in the first command/address signal is a mirror of a second command/address to a memory device from among the one or more second memory devices on the second side of the DIMM.

14. The system of claim 13, the logic to mirror the first command/address to the memory device from among the first one or more memory devices comprises the logic to swap respective even numbered command/addresses to the memory device from among the first one or more memory devices with a respective next higher odd numbered command/addresses to the memory device from among the first one or more memory devices.

15. The system of claim 13, the power pin comprises an output storage drain power voltage (VDDQ) pin.

16. The system of claim 13, comprising the memory device from among the one or more first memory devices having a second strap pin and further including logic to:
receive a second command/address signal; and
interpret a command/address logic indicated by the second command/address signal based on the second strap pin being connected to a same or different power pin of the memory device than what the first strap pin is connected to such that the command/address logic indicated by the second command/address signal is interpreted as being inverted.

17. The system of claim 16, the same or different power pin than what the first strap pin is connected to comprises a same or different output storage drain power voltage (VDDQ) pin of the memory device.

18. The system of claim 16, comprising the command/address logic indicated by the second command/address signal was inverted by circuitry for a register buffer of the DIMM.

19. The system of claim 13, the DIMM comprises a registered DIMM (RDIMM), a low power DIMM (LP-DIMM), a load reduced DIMM (LRDIMM), a fully-buffered DIMM (FB-DIMM), an unbuffered DIMM (UDIMM) or a small outline DIMM (SODIMM).

20. The system of claim 13, comprising the memory device to include non-volatile memory or volatile memory, the volatile memory include dynamic random access memory (DRAM), the non-volatile memory including 3-dimensional cross-point memory, memory that uses chalcogenide phase change material, multi-threshold level NAND flash memory, NOR flash memory, single or multi-level phase change memory (PCM), resistive memory, ovonic memory, nanowire memory, ferroelectric transistor random access memory (FeTRAM), magnetoresistive random access memory (MRAM) memory that incorporates memristor technology, or spin transfer torque MRAM (STT-MRAM).

* * * * *